United States Patent
Miyashita et al.

(10) Patent No.: US 11,823,877 B2
(45) Date of Patent: Nov. 21, 2023

(54) SUBSTRATE PROCESSING SYSTEM, SUBSTRATE PROCESSING METHOD, AND CONTROLLER

(71) Applicant: Tokyo Electron Limited, Tokyo (JP)

(72) Inventors: Koichi Miyashita, Nirasaki (JP); Makoto Horikawa, Nirasaki (JP); Satoshi Gomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 424 days.

(21) Appl. No.: 17/208,445

(22) Filed: Mar. 22, 2021

(65) Prior Publication Data

US 2021/0305029 A1    Sep. 30, 2021

(30) Foreign Application Priority Data

Mar. 30, 2020   (JP) ................................ 2020-059692

(51) Int. Cl.

| H01J 37/32 | (2006.01) |
|---|---|
| C23C 16/458 | (2006.01) |
| C23C 16/52 | (2006.01) |
| C23C 16/50 | (2006.01) |
| C23C 16/08 | (2006.01) |
| C23C 16/34 | (2006.01) |
| C23C 16/455 | (2006.01) |

(52) U.S. Cl.
CPC ........ *H01J 37/32926* (2013.01); *C23C 16/08* (2013.01); *C23C 16/34* (2013.01); *C23C 16/4584* (2013.01); *C23C 16/45565* (2013.01); *C23C 16/50* (2013.01); *C23C 16/52* (2013.01); *H01J 37/32733* (2013.01); *H01J 2237/2487* (2013.01); *H01J 2237/332* (2013.01)

(58) Field of Classification Search
CPC .................. H01J 37/32926; H01L 21/67248
See application file for complete search history.

(56) References Cited

U.S. PATENT DOCUMENTS

| 2018/0038008 A1 | 2/2018 | Mitsuya et al. |
| 2020/0056301 A1 | 2/2020 | Mitsuya et al. |

FOREIGN PATENT DOCUMENTS

| JP | 2004-079985 A | 3/2004 |
|---|---|---|
| JP | 2006-295179 A | 10/2006 |
| JP | 2010-171336 A | 8/2010 |
| JP | 2014-075574 A | 4/2014 |
| JP | 2019-218626 A | 12/2019 |
| KR | 10-2020-0003127 A | 1/2020 |
| TW | 201809363 A | 3/2018 |

*Primary Examiner* — Anthony Ho
(74) *Attorney, Agent, or Firm* — Armstrong Teasdale LLP

(57) ABSTRACT

According to one embodiment of the present disclosure, there is provided a substrate processing system for processing a plurality of substrates including: a processor configured to perform a process on the substrate; a transport device configured to repeatedly transport the plurality of substrates with respect to the processor; and a controller configured to control the process of the substrate in the processor, wherein the controller is configured to: execute the process based on a process recipe, which is a control program for executing the process; and set an offset time, which is a function corresponding to a number of the substrates processed by the processor or a function corresponding to a parameter equivalent to the number of the processed substrates, with respect to a step time for a step of the process recipe.

20 Claims, 5 Drawing Sheets

FIG. 4

| Offset Switching Number of Wafers | 2nd-Order Coefficient a | 1st-Order Coefficient b | Constant c |
|---|---|---|---|
| 0 | x.xxxx | x.xxxx | x.xxxx |
| 100 | x.xxxx | x.xxxx | x.xxxx |
| 200 | x.xxxx | x.xxxx | x.xxxx |
| 300 | x.xxxx | x.xxxx | x.xxxx |
| 400 | x.xxxx | x.xxxx | x.xxxx |

PM1 / Ti

Table being displayed: Table 1

End | Stop | Save | Backup | Restore

FIG. 5

Table 1 | Table 6
Table 2 | Table 7
Table 3 | Table 8
Table 4 | Table 9
Table 5 | Table 10

Set | Stop

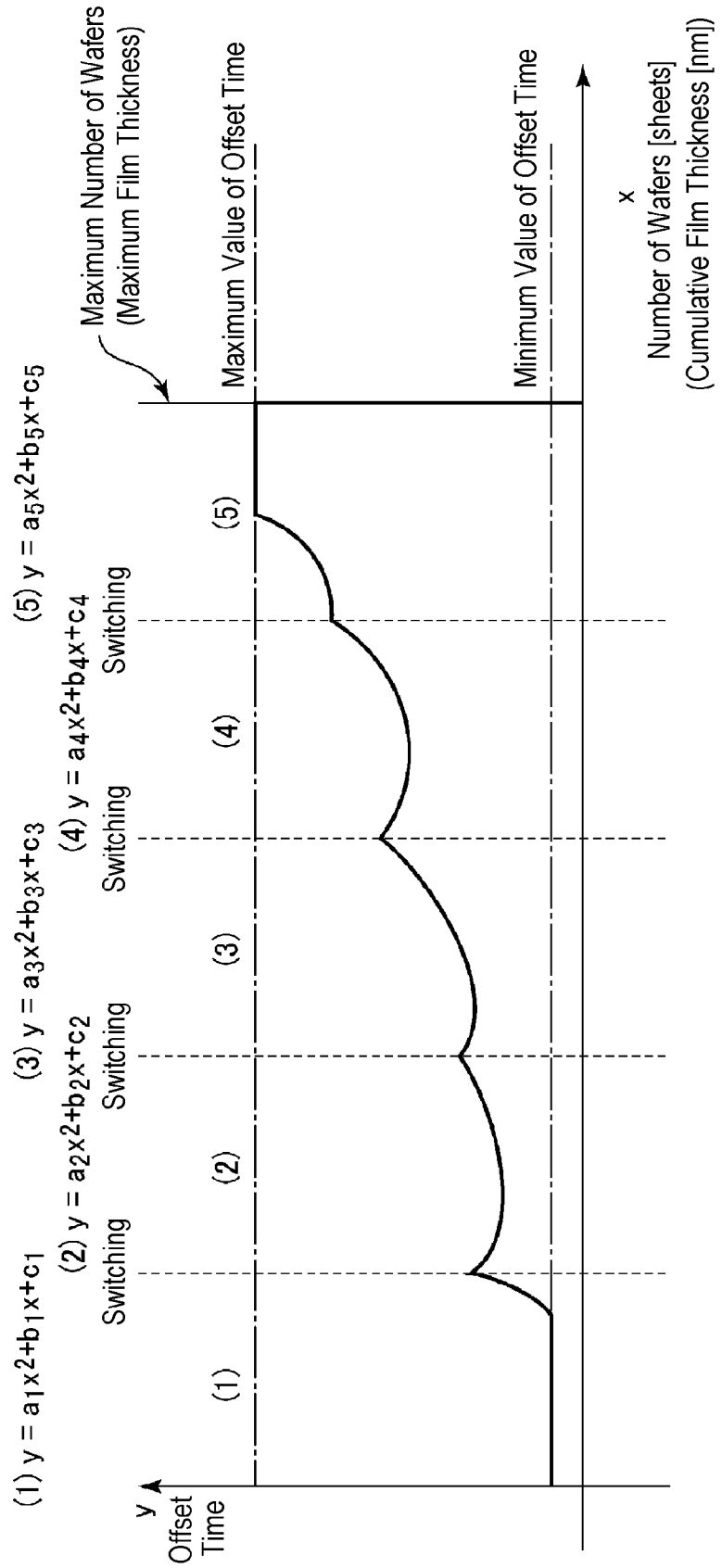

SUBSTRATE PROCESSING SYSTEM, SUBSTRATE PROCESSING METHOD, AND CONTROLLER

CROSS-REFERENCE TO RELATED APPLICATION

This application is based upon and claims the benefit of priority from Japanese Patent Application No. 2020-059692, filed on Mar. 30, 2020, the entire contents of which are incorporated herein by reference.

TECHNICAL FIELD

The present disclosure relates to a substrate processing system, a substrate processing method, and a controller.

BACKGROUND

In a semiconductor manufacturing process, various process control parameters are used to obtain stable processing results. For example, Patent Document 1 describes a CVD film formation in which the temperature of a placement table on which a wafer (a substrate) is placed is controlled to control the temperature of the substrate. Patent Document 1 teaches that, when film formation is repeated on a plurality of wafers (substrates), a film also adheres to an inner wall of the processing container or the like, which reduces the heat reflectance inside the processing container. In addition, since the substrate temperature does not reach a target temperature when the temperature setting is in the initial state, the set temperature value is calibrated.

PRIOR ART DOCUMENT

Patent Document

Patent Document 1: Japanese laid-open publication No. 2004-79985

SUMMARY

According to one embodiment of the present disclosure, there is provided a substrate processing system for processing a plurality of substrates including: a processor configured to perform a process on the substrate; a transport device configured to repeatedly transport the plurality of substrates with respect to the processor; and a controller configured to control the process of the substrate in the processor, wherein the controller is configured to: execute the process based on a process recipe, which is a control program for executing the process; and set an offset time, which is a function corresponding to a number of the substrates processed by the processor or a function corresponding to a parameter equivalent to the number of the processed substrates, with respect to a step time for a step of the process recipe.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a diagram illustrating an exemplary offset time setting screen.

FIG. 5 is a diagram illustrating a selection screen displayed by touching or clicking a table switching button provided on the offset time setting screen of FIG. 4.

FIG. 6 is a diagram schematically illustrating an actual offset time set on the offset time setting screen of FIG. 4.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the accompanying drawings.

<Substrate Processing System>

Figure 1:
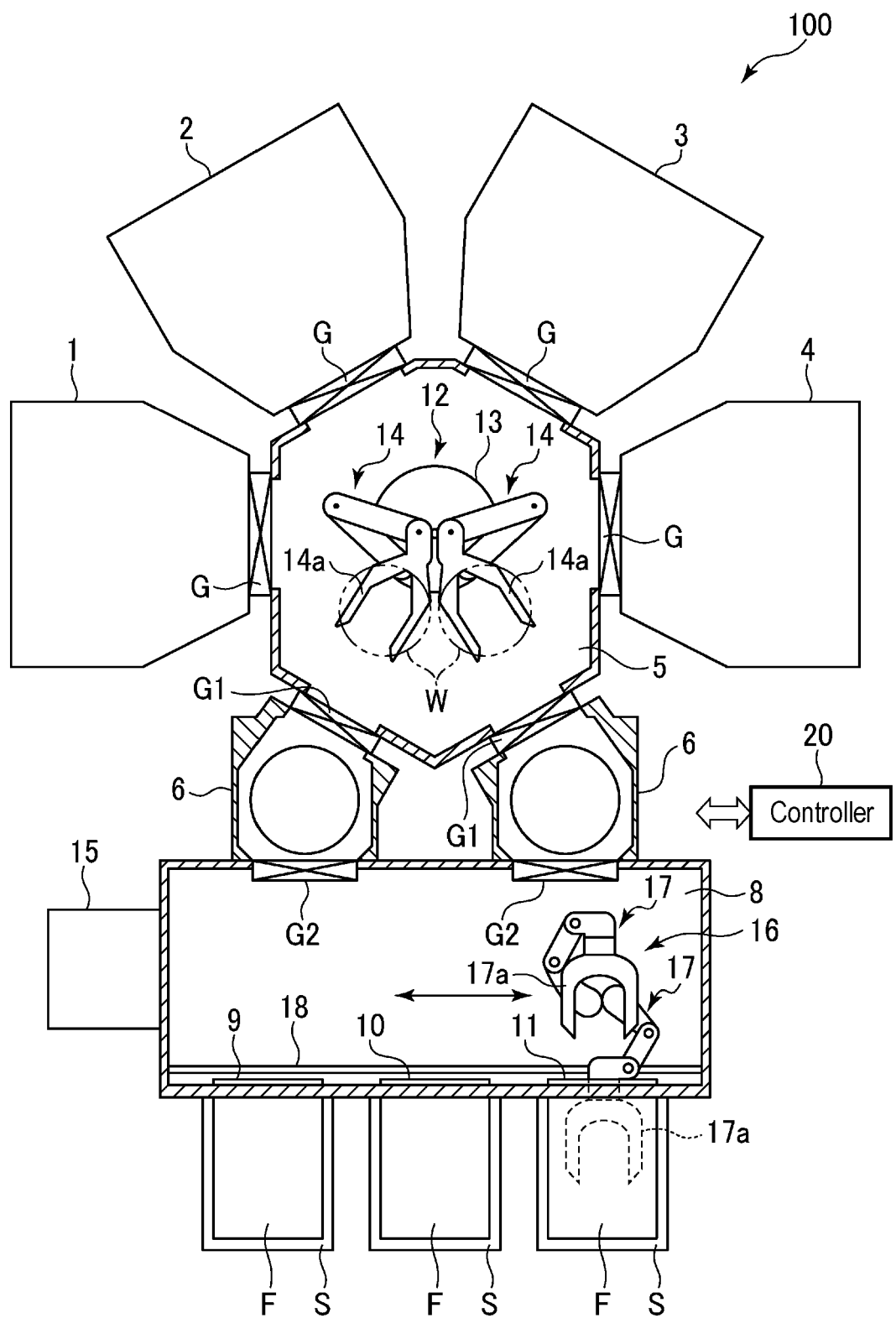
FIG. 1 is a schematic view schematically illustrating a substrate processing system according to an embodiment.

FIG. 1 is a schematic view schematically illustrating a substrate processing system according to an embodiment.

A substrate processing system 100 repeatedly processes a plurality of substrates. Examples of such substrate processing include a film forming process, particularly a film forming process performed through a CVD method, for example, a process of forming a laminated film of a Ti film and a TiN film (a Ti—TiN film forming process). The substrate is not particularly limited, but in the following description, a case where a semiconductor wafer (wafer) is used as a substrate will be described as an example.

As illustrated in FIG. 1, the substrate processing system 100 includes four processors (PMs) 1, 2, 3, and 4, and these processors (PMs) 1 to 4 are provided to correspond to respective walls corresponding to four sides of a hexagonal vacuum transport chamber 5. The inside of the vacuum transport chamber 5 is evacuated by a vacuum pump (not illustrated) and maintained at a predetermined degree of vacuum. An example in which the processors (PMs) 1, 2, 3, and 4 perform the film forming process as described above will be described. In the case of a Ti—TiN film forming process, two of the processors (PMs) 1 to 4 are used for Ti film formation, and the other two are used for TiN film formation. The processors (PMs) 1 to 4 perform a process in a vacuum atmosphere. The processors (PMs) 1 to 4 will be described later.

Two load-lock chambers 6 are connected to the other walls of the vacuum transport chamber 5. An atmospheric transport chamber 8 is connected to the opposite sides of the two load-lock chambers 6 from the vacuum transport chamber 5. The load-lock chambers 6 perform pressure control between atmospheric pressure and a vacuum when a wafer W is transported between the atmosphere transport chamber 8 and the vacuum transport chamber 5. The number of load-lock chambers 6 may be one or three or more.

On the opposite side of the atmospheric transport chamber 8 from the load-lock chambers 6, three ports 9, 10, and 11 are provided to install therein a Front Opening Unified Pod (FOUP), which is a container for accommodating wafers W. A filter (not illustrated) is provided in an upper portion of the atmospheric transport chamber 8 to form a downflow of clean air.

As illustrated in the drawing, the processors (PMs) 1 to 4 are connected to respective walls corresponding to the walls of the vacuum transport chamber 5 via respective gate valves G. Thus, the processors 1 to 4 communicate with the vacuum transport chamber 5 by opening the corresponding gate valves G, and are shut off from the vacuum transport chamber 5 by closing the corresponding gate valves G. In addition, the two load-lock chambers 6 are connected to respective remaining walls of the vacuum transport chamber 5 via first gate valves G1, and are connected to the atmospheric transport chamber 8 via second gate valves G2.

In the vacuum transport chamber 5, a vacuum transport device 12 is provided to load and unload wafers W with respect to the processors (PMs) 1 to 4 and the load-lock chambers 6. The vacuum transport device 12 has a base 13 arranged substantially in the center of the vacuum transport chamber 5, and two articulated arms 14 having a base end attached to the base 13. The wafers W are transported in the state of being supported by hands 14*a* provided at the tip ends of the articulated arms 14.

A shutter (not illustrated) is provided in each of the ports 9, 10 and 11 of the atmospheric transport chamber 8, and FOUPs F, which are wafer accommodation containers, are directly installed on respective stages of the ports 9, 10, and 11, in an empty state or in the state of accommodating a wafer W. When the FOUPs F are installed, the shutters are released to allow the FOUPs F to communicate with the atmospheric transport chamber 8 while preventing infiltration of external air. An alignment chamber 15 is provided on a side surface of the atmospheric transport chamber 8, and wafers W are aligned there.

An atmospheric transport device 16 is provided in the atmospheric transport chamber 8 to perform loading/unloading of wafers W to/from the FOUPs F and to perform loading/unloading of wafers W to/from the load-lock chambers 6. The atmospheric transport device 16 has two articulated arms, and these two articulated arms 17 are configured to travel on a rail 18 along the direction in which the FOUPs F are arranged to transport wafers W in the state of supporting the wafers W on hands 17*a* at the tip ends thereof.

The substrate processing system 100 has a controller 20 configured to control the process. The controller 20 will be described in detail later.

In this substrate processing system 100, first, wafers W are taken out from FOUPs F connected to the atmospheric transport chamber 8 by the support arms 17 of the atmospheric transport device 16 and are loaded into the load-lock chambers 6 of the atmospheric atmosphere. Then, after the load-lock chambers 6 into which the wafers W are loaded are turned into a vacuum state corresponding to the vacuum transport chamber 5, each of the wafers W in the load-lock chambers 6 is loaded into one of the processors (PMs) by the hand 14*a* of one of the articulated arms 14 of the vacuum transport device 12. In a processor (PM) into which the wafer W is loaded, the process such as the film forming process is performed.

After the substrate processing in the processor (PM) is completed, the hand 14*a* of one of the articulated arms 14 of the vacuum transport device 12 unloads the wafer W out of the processor (PM) and transports the wafer W to the load-lock chamber 6. Then, after the load-lock chamber 6 into which the wafer W is loaded is brought into an atmospheric atmosphere state, the wafer W is unloaded out of the load-lock chamber and accommodated in a FOUP F by the support arm 17 of the atmospheric transport device 16.

The processes described above are simultaneously performed on a plurality of wafers W to process all the wafers W in the FOUPs F. Then, the wafers W are continuously processed while exchanging the FOUPs F until a maintenance cycle is reached.

<Processor>

Next, a structural example of the processor (PM) will be described.

Figure 2:
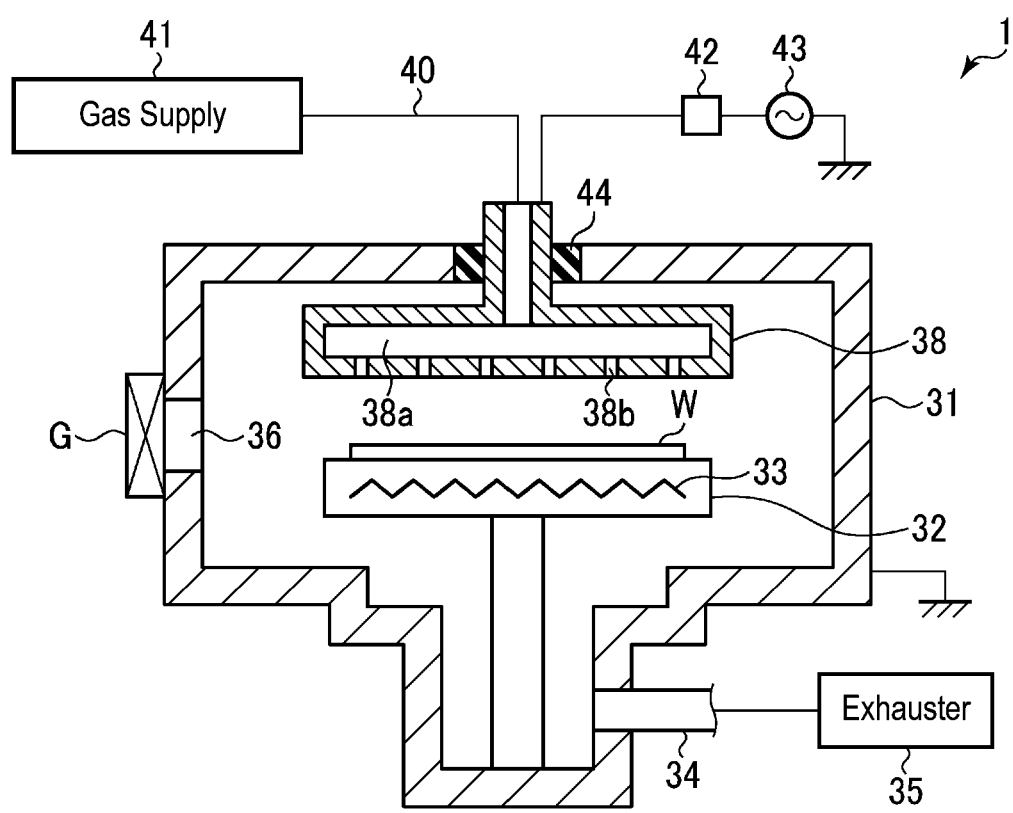
FIG. 2 is a cross-sectional view illustrating an exemplary processor (PM) mounted on the substrate processing system of FIG. 1.

FIG. 2 is a cross-sectional view illustrating an exemplary processor (PM), which performs, for example, the film forming process. Although FIG. 2 illustrates the processor (PM) 1, the basic structures of the processors (PMs) 2 to 4 are the same as that of the processor (PM) 1.

The processor (PM) 1 has a chamber 31. A placement stage 32 is provided in the chamber 31 to horizontally place thereon a wafer W, which is a substrate. A heater 33 is provided inside the placement stage 32 to heat the wafer W to a predetermined temperature. The output of the heater 33 is controlled based on a signal from a temperature sensor (not illustrated) provided within the placement stage 32 at a position in the vicinity of the wafer W such that the temperature of the wafer W (the placement stage 32) becomes a predetermined temperature.

An exhaust pipe 34 is connected to a bottom portion of the chamber 31, and an exhauster 35 having a function of controlling the pressure within the chamber 31 is connected to the exhaust pipe 34. A transport port 36 is formed in the side wall of the chamber 31 to transport the wafer W therethrough, and the transport port 36 is opened/closed by the gate valve G.

A gas shower head 38 is provided in an upper portion of the chamber 31 to face the placement stage 32. The gas shower head 38 has a gas chamber 38*a* therein, and has a plurality of gas ejection holes 38*b* in a bottom portion thereof. The gas shower head 38 and a ceiling wall of the chamber 31 are insulated by an insulating member 44.

A gas supply 41 is connected to the gas shower head 38 via a gas flow path 40. The gas supply 41 supplies a gas for film formation. As the gas for film formation, a film-forming source gas, a reaction gas, and an inert gas are supplied. The film-forming source gas and the reaction gas are appropriately selected according to the film to be formed. The inert gas is used as a carrier gas, a diluting gas, a plasma generation gas or the like. When forming a Ti film, for example, $TiCl_4$ gas is used as the film-forming source gas, and, for example, $H_2$ gas is used as the reaction gas. When forming a TiN film, for example, $TiCl_4$ gas is used as the film-forming source gas, and, for example, $NH_3$ gas is used as the reaction gas.

A high-frequency power supply 43, which is a plasma generator, is connected to the gas shower head 38 via a matcher 42. The high-frequency power supply 43 applies high-frequency power of, for example, 13.56 MHz to the gas shower head 38. When the high-frequency power is applied to the gas shower head 38, a high-frequency electric field is formed between the gas shower head 38 and the placement stage 32, and capacitively coupled plasma is generated by the gas ejected from the gas shower head 38. The plasma generator may be one that generates inductively coupled plasma or microwave plasma. In addition, according to the film to be formed, the plasma generator may not be provided. For example, the plasma generator is used when forming a Ti film, and the plasma generator is not required when forming a TiN film.

In the processor (PM) 1 configured in this way, a wafer W is placed on the placement stage 32, the wafer W is heated to the set temperature by the heater 33 via the placement stage 32, and the exhauster 35 performs evacuation to control the pressure. Then, a gas containing the film-forming source gas and the reaction gas is supplied into the chamber 31 from the gas supply 41 through the gas shower head 38, and the high-frequency power is supplied from the high-frequency power supply 43 to the gas shower head as needed, thereby plasmatizing the gas supplied into the chamber 31. As a result, a desired film is formed on the wafer W.

<Controller>

Next, the controller 20 will be described.

Figure 3:
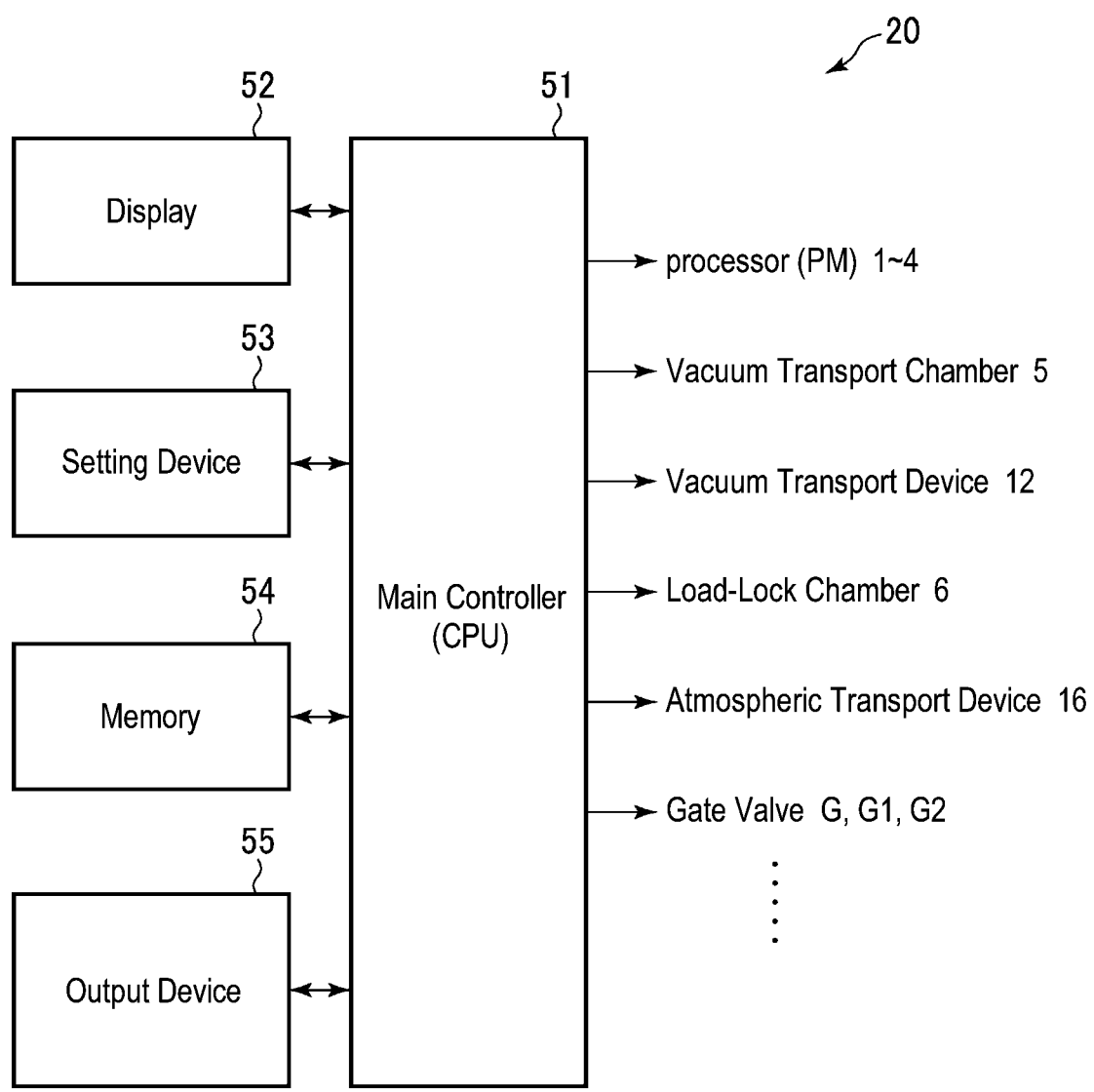
FIG. 3 is a block diagram illustrating a controller for controlling the substrate processing system of FIG. 1.

FIG. 3 is a block diagram illustrating the main parts of the controller 20. As illustrated in FIG. 3, the controller 20 includes a main controller 51, a display 52, a setting device 53, a memory 54, and an output device 55.

The main controller 51 has a CPU and executes control of each component that constitutes the substrate processing system 100. The each component is any of, for example, the processor (PM) 1 to 4, the vacuum transfer chamber 5, the vacuum transfer device 12, the load lock chamber 6, the atmosphere transfer device 16, and the gate valves G, G1, and G2, and in the processor (PM), for example, the gas supply 41, the exhauster 35, and the heater 33 are individually controlled. In addition, in the vacuum transport chamber 5, a vacuum exhaust system is controlled.

The memory 54 has a built-in storage medium such as a hard disk in which data required for control is stored. In addition, the memory 54 is configured to be capable of setting therein a portable storage medium in which data required for control is stored. The storage medium stores, for example, a process recipe for executing the process in the substrate processing system 100 and other control data. A plurality of process recipes are stored in the storage medium corresponding to the processors (PMs) 1 to 4. There may be the plurality of process recipes for each processor (PM).

Various process parameters are set in the process recipes, but this embodiment is characterized by setting an offset time with respect to a step time as a process parameter. The offset time is a function corresponding to the number of processed wafers W or a parameter equivalent to the number of the processed wafers W, and is added to the step time initially set in the process recipe, thereby adjusting the step time. That is, the controller 20 has a function of setting the offset time with respect to the step time initially set in the process recipe (a function of adding the offset time to the step time). The step time of the process recipe is the time of a step for performing the process in the processor (PM), and is typically a processing time for performing a desired process, for example, a film forming time in the case of the film forming process. The offset time will be described in detail later.

The setting device 53 is for performing setting necessary for the process, and performs various kinds of setting by inputting necessary information. An input device such as a keyboard may be used as the setting device 53. When the display 52 is a touch panel display, the display 52 also functions as the setting device 53.

A plurality of screens having information necessary for the process performed by the substrate processing system 100 are displayed on the display 52. For example, a plurality of operation screens for performing a specific operation of the substrate processing system 100 are displayed. The display 52 may be a touch panel display. Various settings may be made on the operation screens displayed on the display 52. That is, various settings may be made using the setting device 53 in the state in which the operation screens are displayed on the display 52. When the display 52 is a touch panel display, these operation screens themselves function as the setting device 53.

The operation screens may include an offset time setting screen on which the offset time to be added to the above-mentioned step time may be set.

<Offset Time>

Next, the offset time will be described in detail.

In the substrate processing system 100, as described above, a plurality of wafers W are repeatedly processed by the processors (PMs) 1 to 4, and as the number of the processed wafers W increases, the state inside the chambers 31 changes. Therefore, when the process parameters set in the process recipe are left in the initial state, a desired process may not be performed. In particular, when the process performed in the processors (PM) 1 to 4 is the film forming process, for example, a CVD film forming process, as the number of the processed wafers W increases, the amount of reaction products adhering to inner walls of the chambers 31 increases. Therefore, when the number of the processed wafers W increases, the state in the chambers 31 may significantly change from the initial state, which makes it difficult to perform a desired process.

Therefore, in the present embodiment, the controller 20 has the function of setting the offset time, which is the function corresponding to the number of the processed wafers W or the parameter equivalent to the number of the processed wafers W with respect to the step time (the processing time) initially set in the process recipe (the function of adding the offset time to the step time). The setting of the offset time is performed prior to performing the process, and the process is performed after setting the offset time.

In the case of this embodiment, a film forming apparatus is illustrated as the processor (PM). In the case of the film forming apparatus, a cumulative film thickness may be used as the parameter equivalent to the number of the processed wafers.

In this way, by adding the offset time to the step time of the process recipe, it is possible to optimize the process relatively easily even if the number of the processed wafers W increases. Conventionally, in the processor (PM) that performs the film forming process, a deviation in processing results caused by a change in the chamber state due to the increase in the number of wafers W has been corrected by applying an offset to process parameters such as a temperature of a placement table and high-frequency power. However, adjustment of parameters such as temperature and RF power requires a lot of data and trial and error, which reduces throughput. In addition, changing the step time itself of the process recipe also requires precise adjustment based on the processing results, which also reduces throughput. In contrast, by setting the offset time, which is the function corresponding to the number of the processed wafers (or a cumulative film thickness), with respect to the step time of the process recipe, the process recipe itself is not changed, which makes it possible to relatively easily and flexibly optimize the process so that fluctuations in the processing results can be suppressed.

The offset time is preferably a quadratic function of the number of the processed wafers W or the parameter equivalent to the number of the processed wafers W. In this case, when the number of the processed wafers W or the parameter equivalent to the number of the processed wafers W (e.g., the cumulative film thickness in the case of film formation) is x, the offset time y may be expressed as $y=ax^2+bx+c$ (where a, b, and c are constants).

One offset time may be prepared for each processor (PM), and it is possible to set whether or not the offset time is applied using the setting device 53.

In addition, the offset time setting screen may be provided as the operation screen displayed on the display 52, and the offset time may be set on the offset time setting screen. Specifically, a, b, and c of the quadratic function $y=ax^2+bx+c$ are set on the offset time setting screen. As a result, the offset time can be set arbitrarily. Therefore, the step time can be flexibly adjusted according to the process.

On the offset time setting screen, the offset time can be set according to the number of the processed wafers W (or the cumulative film thickness). In addition, the offset time can be set for each process recipe used in each processor.

FIG. 4 is a diagram illustrating an exemplary offset time setting screen. The offset time setting screen 60 of FIG. 4 illustrates the process recipe for forming a Ti film in the processor (PM) 1. In an upper left portion of the offset time setting screen 60, there is a status display 61, which displays information on the processor for which the offset time is set.

A table 62 for setting is displayed on the offset time setting screen 60. In this table 62, the offset time setting can be switched according to the number of the processed wafers W or the cumulative film thickness. In FIG. 4, the table 62 is configured such that the "Number of Wafers" is displayed to switch the offset time setting according to the number of wafers W, and a $2^{nd}$-order coefficient a, a $1^{st}$-order coefficient b, and a constant c of the offset time represented by the quadratic function $y=ax^2+bx+c$ can be input for each step of the number of wafers. Specifically, regarding the number of the processed wafers, up to 100 wafers corresponds to the first step, up to 200 wafers corresponds to the second step, up to 300 wafers corresponds to the third step, up to 400 wafers corresponds to the fourth step, and more than 400 wafers corresponds to the fifth step. When the substrate process is the film forming process, the cumulative film thickness as the parameter equivalent to the number of wafers W may be as a variable for switching the offset time setting, instead of the number of wafers W. At that time, the display of the number of wafers can be switched to the display of the cumulative film thickness by touching or clicking the offset switching button 63 indicated as "Offset Switching" in an upper left portion of the offset time setting screen 60. When the number of wafers is indicated, "Number of Wafers" is indicated on the offset switching button 63, but when the offset switching button 63 is touched or clicked, the indication is switched to "Film Thickness".

There is a table switching button 64 in an upper right portion of the offset time setting screen 60. The number of the displayed table is indicated on the table switching button 64, and the table switching button 64 is labeled as "Table being displayed". In the example of FIG. 4, "Table 1" corresponding to the process recipe of the processor (PM) 1 is indicated on the table switching button 64. By touching or clicking the table switching button 64, for example, a selection screen having a plurality of table number selection buttons corresponding to the plurality of process recipes of the plurality of processors is displayed, as illustrated in FIG. 5. Then, it is possible to select the table number for which the offset time is to be set by touching or clicking one of the selection buttons. That is, it is possible to set the offset time by selecting a table having a desired table number from among the plurality of tables, which correspond to the plurality of process recipes, respectively.

When the offset time is set by the setting device 53 using the offset time setting screen, the process recipe corresponding to the selected offset time setting screen is called by the main controller 51. Then, in the main controller 51, the set offset time is added to the step time of the corresponding process recipe based on the setting information of the setting device 53.

FIG. 6 is a diagram schematically illustrating an actual offset time set on the offset time setting screen of FIG. 4, in which the number of wafers or the cumulative film thickness is represented on the x-axis and the offset time is represented on the y-axis. In FIG. 6, (1) to (5) indicate the first step, the second step, the third step, the fourth step, and the fifth step of FIG. 4, and the offset time represented by a quadratic function of x is set in each of these steps. The offset time is $y=a_1x^2+b_1x+c_1$ in the first step, $y=a_2x^2+b_2x+c_2$ in the second step, $y=a_3x^2+b_3x+c_3$ in the third step, $y=a_4x^2+b_4x+c_4$ in the fourth step, and $y=a_5x^2+b_5x+c_5$ in the fifth step. In addition, in the example of FIG. 6, the minimum value and the maximum value of the offset time are set to function as limiters when the set function is less than the minimum value or exceeds the maximum value. The minimum value and the maximum value are set to suppress excessive film formation and to ensure minimum film formation. However, the minimum value and the maximum value may not be provided, or only one thereof may be provided. In the example of FIG. 6, the maximum value of the number of wafers (or cumulative film thickness) for which the offset time setting is effective is specified.

In this way, by setting the offset time function according to the number of wafers and the cumulative film thickness, it is possible to finely adjust the step times, so that the process can be further optimized and fluctuations in processing results can be further suppressed.

In addition, for other process recipes, the offset time functions can be set according to the number of wafers and the cumulative film thickness. That is, the offset time function can be set for each process recipe according to the number of wafers and the cumulative film thickness. Therefore, the process can be optimized for each process recipe.

<Other Applications>

Although the embodiments have been described above, it should be considered that the embodiments disclosed herein are examples in all respects and are not restrictive. The above-described embodiments may be omitted, replaced, or modified in various forms without departing from the scope and spirit of the appended claims.

For example, in the embodiment described above, the case where the film forming process such as a Ti—TiN film forming process is mainly performed as the process is illustrated, but the present disclosure is not limited thereto. The case where the step time for applying the offset time is the main target processing time (e.g., a film forming time in the case of the film forming process) has been illustrated, but the step time is not limited thereto. In addition, the parameter to be offset is not limited to the processing time, and may be the set temperature of the placement stage.

The illustrated processing system and processors are merely examples, and the disclosure is not limited thereto, as long as they are capable of continuously processing a plurality of substrates.

The case where the semiconductor wafer is used as the substrate has been described, but the substrate is not limited to the semiconductor wafer. The substrate may be another substrate such as a flat panel display (FPD) substrate represented by a liquid crystal display (LCD) substrate or a ceramic substrate.

According to the present disclosure, a substrate processing system, a substrate processing method, and a controller capable of more effectively suppressing fluctuations in processing results are provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system for processing a plurality of substrates, the substrate processing system comprising:
a processor configured to perform a process on the substrate;
a transport device configured to repeatedly transport the plurality of substrates with respect to the processor; and
a controller configured to control the process of the substrate in the processor,
wherein the controller is configured to:
execute the process based on a process recipe, which is a control program for executing the process; and
set an offset time, which is a function corresponding to a number of the substrates processed by the processor or a function corresponding to a parameter equivalent to the number of the processed substrates, with respect to a step time for a step of the process recipe.

2. The substrate processing system of claim 1, wherein the function is a quadratic function.

3. The substrate processing system of claim 1, wherein the processor is configured to perform a film forming process on the substrate, and the parameter equivalent to the number of the processed substrates is a cumulative film thickness.

4. The substrate processing system of claim 1, wherein the controller includes a display configured to display information necessary for the process thereon, and an offset time setting screen for setting the offset time is displayed on the display such that the offset time is set on the offset time setting screen.

5. The substrate processing system of claim 4, wherein the offset time setting screen has a table in which the offset time of a plurality of steps is capable of being set according to the number of the substrates processed by the processor or according to the parameter.

6. The substrate processing system of claim 5, wherein the controller includes a plurality of process recipes, the table is provided for each of the process recipes, and the offset time setting screen is capable of displaying any one of the tables corresponding to the plurality of the process recipes.

7. The substrate processing system of claim 6, wherein substrate processing system comprises a plurality of processors including the processor, and the plurality of the process recipes correspond to any one of the plurality of the processors.

8. The substrate processing system of claim 1, wherein the controller is configured to set at least one of a minimum value and a maximum value of the offset time as a limiter.

9. A substrate processing method for performing a process on a plurality of substrates by a processor based on a process recipe, which is a control program for performing the process, the substrate processing method comprising:

setting an offset time, which is a function corresponding to a number of the substrates processed by the processor or a function corresponding to a parameter equivalent to the number of the processed substrates, with respect to a step time for a step of the process recipe; and
processing the substrate based on the process recipe in which the offset time is set by repeatedly transporting the plurality of substrates to the processor.

10. The substrate processing method of claim 9, wherein the function is a quadratic function.

11. The substrate processing method of claim 9, wherein the processor is configured to perform a film forming process on the substrate, and the parameter equivalent to the number of the processed substrates is a cumulative film thickness.

12. The substrate processing method of claim 9, wherein an offset time setting screen for setting the offset time is displayed on a display configured to display information necessary for the process thereon such that the offset time is set on the offset time setting screen.

13. The substrate processing method of claim 12, wherein the offset time setting screen has a table in which the offset time of a plurality of steps is capable of being set according to the number of the substrates processed by the processor or according to the parameter.

14. The substrate processing method of claim 13, wherein a plurality of process recipes are provided, the table is provided for each of the process recipes, and the offset time setting screen is capable of displaying any one of the tables corresponding to the plurality of the process recipes.

15. The substrate processing method of claim 14, wherein the process is performed by a plurality of processors including the processor, and the plurality of the process recipes correspond to any one of the plurality of the processors.

16. The substrate processing method of claim 9, wherein at least one of a minimum value and a maximum value of the offset time is set as a limiter.

17. A controller for controlling a substrate processing system that processes a plurality of substrates, the controller comprising:
a processor configured to perform a process on the substrate and
a transport device configured to repeatedly transport the plurality of substrates to the processor,
wherein the controller is configured to:
execute the process based on a process recipe, which is a control program for executing the process; and
set an offset time, which is a function corresponding to a number of the substrates processed by the processor or a function corresponding to a parameter equivalent to the number of the processed substrates, with respect to a step time for a step of the process recipe.

18. The controller of claim 17, wherein the function is a quadratic function.

19. The controller of claim 17 further comprising a display configured to display information necessary for the process thereon,
wherein an offset time setting screen for setting the offset time is displayed on the display such that the offset time is set on the offset time setting screen.

20. The controller of claim 19, wherein the offset time setting screen has a table in which the offset time of a plurality of steps is capable of being set according to the number of the substrates processed by the processor or according to the parameter.

* * * * *